United States Patent [19]

Ide et al.

[11] Patent Number: 5,736,657
[45] Date of Patent: Apr. 7, 1998

[54] SPUTTERING TARGET

[75] Inventors: Yukio Ide, Mishima; Hiroko Iwasaki, Machida; Yoshiyuki Kageyama, Yokohama; Yujiro Kaneko, Tokyo; Katsuyuki Yamada, Mishima; Michiaki Shinotsuka; Makoto Harigaya, both of Hiratsuka; Hiroshi Deguchi, Yokohama, all of Japan

[73] Assignee: Ricoh Company, Ltd., Tokyo, Japan

[21] Appl. No.: 622,681

[22] Filed: Mar. 26, 1996

[30] Foreign Application Priority Data

| Mar. 31, 1995 | [JP] | Japan | 7-100078 |
| May 12, 1995 | [JP] | Japan | 7-138636 |
| Aug. 14, 1995 | [JP] | Japan | 7-228589 |
| Jan. 26, 1996 | [JP] | Japan | 8-032892 |

[51] Int. Cl.$^6$ .................................... C22C 29/00
[52] U.S. Cl. ............... 75/230; 428/64.5; 428/694 MT; 428/913; 420/576; 430/270.13
[58] Field of Search ............... 75/230; 428/64.5, 428/694 MT, 913; 420/576; 430/270.13

[56] References Cited

U.S. PATENT DOCUMENTS

| 5,011,723 | 4/1991 | Harigaya et al. | 428/64 |
| 5,024,927 | 6/1991 | Yamada et al. | 430/495 |
| 5,080,947 | 1/1992 | Yamada et al. | 428/64 |
| 5,100,700 | 3/1992 | Ide et al. | 428/64 |
| 5,156,693 | 10/1992 | Ide et al. | 148/403 |
| 5,298,305 | 3/1994 | Shinozuka et al. | 428/64 |
| 5,523,140 | 6/1996 | Tominaga et al. | 428/64.1 |

Primary Examiner—Ngoclan Mai
Attorney, Agent, or Firm—Cooper & Dunham LLP

[57] ABSTRACT

A sputtering target contains a target material including as constituent elements Ag, In, Te and Sb with the respective atomic percents (atom. %) of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\alpha+\beta+\gamma+\delta=100$, and a method of producing the above sputtering target is provided. An optical recording medium includes a recording layer containing a phase-change recording material which includes as constituent elements Ag, In, Te and Sb with the respective atomic percents of $\alpha$, $\beta$, $\gamma$ and $\delta$ thereof being in the relationship of $1 \leq \alpha < 6$, $7 \leq \beta \leq 20$, $20 \leq \gamma \leq 35$, $35 \leq \delta \leq 70$, and $\alpha+\beta+\gamma+\delta=100$, and is capable of recording and erasing information by utilizing the phase change of the recording material in the recording layer. A method of forming the above recording layer for the optical recording medium is also provided. In addition, there is provided an optical recording method using the above-mentioned phase-change optical recording medium.

2 Claims, 10 Drawing Sheets

SPUTTERING TARGET

BACKGROUND OF THE INVENTION

FILED OF THE INVENTION

The present invention relates to a sputtering target for fabricating a recording layer of an optical recording medium; a method of producing the sputtering target; a phase-change optical recording medium comprising a recording material in a recording layer thereof, which recording material is capable of causing changes in the phase thereof by the application of a light beam thereto, thereby recording, reproducing and overwriting information therein; a method of forming the recording layer for the above-mentioned phase-change optical recording medium by using the above-mentioned sputtering target; and an optical recording method using the above-mentioned phase-change optical recording medium which is suitable for the application of optical memory devices, in particular, rewritable compact disk (CD-rewritable) application.

DISCUSSION OF BACKGROUND

There is conventionally known a phase-change optical information recording medium which utilizes phase changes between a crystalline phase and an amorphous phase or between one crystalline phase and another crystalline phase as one of the optical recording media which are capable of recording, reproducing and erasing information by the application thereto of electromagnetic waves, such as a laser beam. This kind of phase-change optical information recording medium enables the overwriting of information by the application of a single laser beam thereto, although such overwriting is difficult to conduct by the application of a single laser beam in magneto-optical memory using a magneto-optical recording medium. An optical system of a drive unit for the phase-change type optical information recording medium can be designed simpler than that for a magneto-optical recording medium, so that recently research and development of this kind of recording medium has been actively conducted.

As disclosed in U.S. Pat. No. 3,530,441, the so-called chalcogen-based alloys, such as Ge—Te, Ge—Te—Sn, Ge—Te—S, Ge—Se—S, Ge—Se—Sb, Ge—As—Se, In—Te, Se—Te and Se—As, are conventionally used as recording materials for the phase-change optical recording medium. In addition, it is proposed to add an element of Au to the above-mentioned Ge—Te based alloy to improve the stability and to increase the rate of crystallization of the recording material as disclosed in Japanese Laid-Open Patent Application 61-219692. Furthermore, the addition of Sn and Au to the Ge—Te based alloy, and the addition of Pd to the same are respectively proposed in Japanese Laid-Open Patent Applications 61-270190 and 62-19490 for the same purposes as mentioned above. Furthermore, recording materials comprising a mixture of Ge, Te, Se and Sb, and a mixture of Ge, Te and Sb are respectively disclosed in Japanese Laid-Open Patent Applications 62-73438 and 63-228433, each of which has specific composition ratios of constituent elements of the recording material for the improvement of the recording and erasing repetition properties of the obtained recording medium.

However, none of the above-mentioned conventional phase-change optical recording media satisfies all the requirements for the phase-change rewritable optical recording medium.

Japanese Laid-Open Patent Application 63-251290 discloses an optical information recording medium which comprises a recording layer comprising a compound of a multi-component system composed of substantially three or more components in a single crystalline phase. The single crystalline phase of the compound of a multi-component system composed of substantially three or more components is considered to contain a compound with a stoichiometric composition, for example, $In_3SbTe_2$, in the recording layer in an amount of 90 atom % or more. It is mentioned that recording and erasing characteristics can be improved to some extent by the provision of this kind of recording layer. However, this optical information recording medium has the shortcomings that the erasability is low and the laser power required for recording and erasing cannot be sufficiently reduced.

Furthermore, Japanese Laid-Open Patent Application 1-277338 discloses an optical recording medium which comprises a recording layer comprising an alloy with a composition represented by the formula of $(Sb_aTe_{1-a})_{1-b}M_b$, wherein $0.4 \leq a < 0.7$, $b \leq 0.2$, and M is one element selected from the group consisting of Ag, Al, As, Au, Bi, Cu, Ga, Ge, In, Pb, Pt, Se, Si, Sn and Zn. The basic system of the aforementioned alloy is $Sb_2Te_3$, and the addition of a large excess of Sb to this composition in terms of atomic percentage enables high-speed erasing operation and improves the repetition properties. The addition of the element M can further enhance the high-speed erasing performance. In addition to the above advantages, this reference asserts that the erasability by the application of DC light is increased. However, this reference does not show any specific erasability obtained at the overwriting operation, and according to the experiments conducted by the inventors of the present invention, the erasability in the course of the overwriting operation is unsatisfactory and the recording sensitivity is insufficient for use in practice.

Japanese Laid-Open Patent Application 60-177446 discloses an optical recording medium which comprises a recording layer comprising an alloy with a composition represented by the formula of $(In_{1-x}Sb_x)_{1-y}M_y$, wherein $0.55 \leq x \leq 0.80$, $0 \leq y \leq 0.20$, and M is one element selected from the group consisting of Au, Ag, Cu, Pd, Pt, Al, Si, Ge, Ga, Sn, Te, Se and Bi. In addition, Japanese Laid-Open Patent Application 63-228433 discloses a recording layer of an optical recording medium, which comprises an alloy with a composition of GeTe—$Sb_2Te_3$—Sb (excess). The sensitivity and erasability required for the recording medium cannot be satisfied in any of the above-mentioned conventional optical recording media.

In addition, a recording layer of an optical recording medium is made of a Te—Ge—Sb alloy, with the addition thereto of nitrogen atom, as disclosed in Japanese Laid-Open Patent Application 4-163839; a recording layer is made of a Te—Ge—Se alloy, with the addition thereto of a nitride comprising at least one element of Te, Ge or Se, as disclosed in Japanese Laid-Open Patent Application 4-52188; and a recording layer is made of a Te—Ge—Se alloy, with nitrogen atom being adsorbed thereby.

However, there are still some problems remaining unsolved in those conventional optical recording media.

As previously mentioned, most important points to be improved in the conventional phase-change optical recording media are to enhance the recording sensitivity and erasing sensitivity, to prevent the decrease of the erasability in the course of the overwriting operation, which is caused by the portions remaining unerased, and to increase the life of a recorded portion and that of a non-recorded portion.

With the rapid spread of a compact disk (CD), a write-once compact disk (CD-R) capable of writing data therein only once has been developed and put on the market. However, if the user does not succeed in writing the data in the CD-R, the CD-R becomes unavailable because it is impossible to correct the data. To compensate such a shortcoming of the CD-R, a rewritable compact disk is eagerly expected to be put to practical use.

A rewritable compact disk has been researched and developed by utilizing the magneto-optical recording medium, but the compact disk thus obtained has the shortcomings that there is difficulty in satisfactorily carrying out the overwriting operation, and the compatibility with the CD-ROM or CD-R is poor. Since it is considered that a phase-change optical recording medium can ensure the compatibility with the CD-ROM or CD-R more favorably in principle when compared with the above-mentioned rewritable compact disk of a magneto-optical type, the application of the phase-change optical recording medium to the rewritable compact disk has been actively researched and developed recent years.

Such a rewritable compact disk obtained from the phase-change optical recording medium is reported in some references, for instance, "Proceedings of the 4th Symposium on Phase-Change Recording" p. 70 (1992), Furuya et al.; "Proceedings of the 4th Symposium on Phase-Change Recording" P.76 (1992), Jinno et al.; "Proceedings of the 4th Symposium on Phase-Change Recording" p. 82 (1992), Kawanishi et al.; Jpn. J. Appl. Phys. 32 (1993) p. 5226, T. Handa et al.; "Proceedings of the 5th Symposium on Phase-Change Recording" p. 9 (1993), Yoneda et al.; and "Proceedings of the 5th Symposium on Phase-Change Recording" p. 5 (1993), Tominaga et al. However, none of the rewritable compact disks reported in the aforementioned references is satisfactory with respect to the overall performance, such as the compatibility with CD-R, recording and erasing performance, recording sensitivity, maximum number of repeated overwriting operations, maximum number of repeated reproducing operations, and shelf stability. Those drawbacks are mainly ascribed to low erasability due to the composition and configuration of a recording material employed in each compact disk.

Under such present conditions, there is increasing a demand for development of a phase-change recording material with high erasability, and high recording and erasing sensitivities, and in addition, a phase-change rewritable compact disk capable of exhibiting excellent overall performance.

To meet the aforementioned demand, the inventors of the present invention have proposed Ag—In—Sb—Te based recording materials, for example, as disclosed in Japanese Laid-Open Patent Applications 4-78031 and 4-123551; Jpn. J. Appl. Phys. 31 (1992) 461, H. Iwasaki et al.; "Proceedings of the 3rd Symposium on Phase-Change Recording" p. 102 (1991), Ide et al.; and Jpn. J. Appl. Phys. 32 (1993) 5241, H. Iwasaki et al.

It became apparent that the phase-change optical disk thus obtained exhibited excellent performance. However, still more endeavors should be made to produce a phase-change optical recording disk which is capable of securely ensuring the compatibility with the CD-R, and perfectly satisfying the previously mentioned overall performance required for the rewritable compact disk, and to establish the method of producing a phase-change optical disk capable of forming a new market.

SUMMARY OF THE INVENTION

Accordingly, a first object of the present invention is to provide a sputtering target for fabricating a recording layer of an optical recording medium with improved C/N ratio, erasability, recording sensitivity, and repetition properties.

A second object of the present invention is to provide a method of producing the above-mentioned sputtering target.

A third object of the present invention is to provide an optical recording medium with improved C/N ratio, erasability, recording sensitivity, and repetition properties.

A fourth object of the present invention is to provide an optical recording medium which is capable of recording information and erasing the same at a disk rotation linear speed of as low as 1.2 to 5.6 m/s, and applicable to a rewritable compact disk.

A fifth object of the present invention is to provide a method of forming a recording layer for the above-mentioned optical recording medium.

A sixth object of the present invention is to provide an optical recording method using the above-mentioned optical recording medium.

The first object of the present invention can be achieved by a sputtering target comprising a target material comprising as constituent elements Ag, In, Te and Sb with the respective atomic percents (atom. %) of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\delta + \beta + \gamma + \alpha = 100$.

It is preferable that the target material for use in the above-mentioned sputtering target comprise Sb, and AgInTe$_2$ with a stoichiometric composition and/or a nearly stoichiometric composition having a chalcopyrite structure and/or zincblende structure, and it is preferable that the AgInTe$_2$ in the target material be in the form of crystallites with a particle size of 450 Å or less.

The second object of the present invention can be achieved by a method of producing a sputtering target which comprises a target material comprising as constituent elements Ag, In, Te and Sb with the respective atomic percents (atom. %) of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\alpha + \beta + \gamma + \delta = 100$, comprising the steps of fusing a mixture of Ag, In and Te elements at a temperature in the range of 550° C. to 850° C. to prepare a fused mixture, rapidly cooling the fused mixture to prepare a solid lump, pulverizing the solid lump to prepare finely-divided particles, mixing the finely-divided particles with Sb, and sintering the mixture of the finely-divided particles and Sb.

Alternatively, the second object of the present invention can also be achieved by a method of producing the sputtering target, comprising the steps of fusing a mixture of Ag, In, Te and Sb elements at a temperature in the range of 550° C. to 850° C. to prepare a fused mixture, and rapidly cooling the fused mixture to prepare a solid lump, pulverizing the solid lump to prepare finely-divided particles, and sintering the finely-divided particles.

In either case, it is preferable that the method of producing the sputtering target further comprise the step of carrying out the heat treatment at a temperature not higher than the melting point of the mixture prior to the sintering step.

The third and fourth objects of the present invention can be achieved by an optical recording medium comprising a recording layer which comprises a phase-change recording material, capable of recording and erasing information by utilizing changes in the phase of the phase-change recording material in the recording layer, the phase-change recording material comprising as constituent elements Ag, In, Te and Sb with the respective atomic percents of $\alpha$, $\beta$, $\gamma$ and $\delta$ thereof being in the relationship of $1 \leq \alpha < 6$, $7 \leq \beta \leq 20$, $20 \leq \gamma \leq 35$, $35 \leq \delta \leq 70$, and $\alpha + \beta + \gamma + \delta = 100$.

In the above-mentioned optical recording medium, it is preferable that the phase-change recording material comprise $AgSbTe_2$ in a crystalline phase when no information is recorded in the recording layer and after information is erased therefrom.

From the aspect of the structure of the optical recording medium, it is preferable that the above-mentioned optical recording medium comprise a substrate in the form of a disk, and a first heat-resistant protective layer, the previously mentioned recording layer, a second heat-resistant protective layer, and a reflective heat dissipation layer made of a metal or an alloy, which are overlaid on the substrate in this order.

Furthermore, in the above-mentioned optical recording medium, it is preferable that the thickness of the first heat-resistant protective layer be in the range of 500 to 2500 Å; the thickness of the recording layer, 100 to 1000 Å; the thickness of the second heat-resistant protective layer, 100 to 1500 Å, and the thickness of the reflective heat dissipation layer, 300 to 2000 Å.

Further, it is preferable that the disk-shaped substrate bear a guide groove with a width of 0.25 to 0.65 μm and a depth of 250 to 650 Å.

In addition, the previously mentioned recording layer may further comprise a nitride and/or oxide comprising at least one of the constituent elements Ag, In, Te and Sb, and in particular, a nitride comprising Te with a bond of Te—N is preferable.

The fifth object of the present invention can be achieved by a method of forming a recording layer for an optical recording medium, comprising the step of sputtering a target which comprises a target material comprising as constituent elements Ag, In, Te and Sb with the respective atomic percents of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\alpha+\beta+\gamma+\delta=100$, in an atmosphere of argon gas, with nitrogen gas being contained therein with a concentration of 0 to 10 mol %.

In the above-mentioned method of forming the recording layer, it is preferable that the back pressure be set in the range of $3\times10^{-7}$ to $5\times10^{-6}$ Torr prior to the sputtering step.

In addition, it is preferable that the partial pressure of the nitrogen gas ($P_N$) be set in the range of $1\times10^{-5}$ Torr $\leq (P_N) \leq 8\times10^{-5}$ Torr when the nitrogen gas is contained in the atmosphere during the sputtering step.

Further, it is preferable that a mixed gas comprising argon gas and nitrogen gas with the concentration of the nitrogen gas being higher than that in the atmosphere during the sputtering step be introduced into a sputter chamber after the sputtering step.

The sixth object of the present invention can be achieved by an optical recording method for recording information in an optical recording medium comprising a disk-shaped substrate, and a first heat-resistant protective layer, a recording layer comprising a phase-change recording material, a second heat-resistant protective layer, and a reflective heat dissipation layer comprising a metal or an alloy, which are overlaid on the substrate in this order, the recording layer being capable of recording and erasing information by utilizing changes in the phase of the phase-change recording material in the recording layer, and the phase-change recording material comprising as constituent elements Ag, In, Te and Sb with the respective atomic percents of $\alpha$, $\beta$, $\gamma$ and $\delta$ thereof being in the relationship of $1 \leq \alpha < 6$, $7 \leq \beta \leq 20$, $20 \leq \gamma \leq 35$, $35 \leq \delta \leq 70$, and $\alpha+\beta+\gamma+\delta=100$, comprising the step of applying a semiconductor laser beam to the optical recording medium, with the optical recording medium being rotated at a linear speed of 1.2 to 5.6 m/s.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
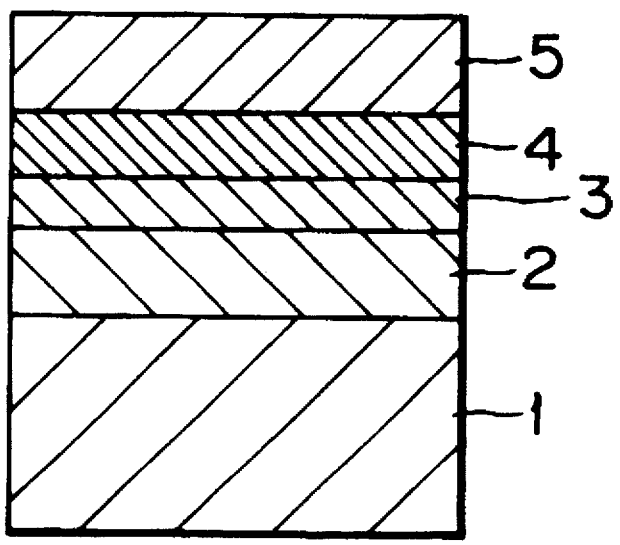
FIG. 1 is a schematic cross-sectional view showing the layer structure of a phase-change optical recording medium according to the present invention.

In order to obtain an optical recording medium of the present invention, a sputtering target for fabricating a recording layer of the optical recording medium can be employed. The sputtering target according to the present invention comprises a target material comprising as constituent elements Ag, In, Te and Sb, with the respective atomic percents (atom. %) of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\alpha+\beta+\gamma+\delta=100$.

It is preferable that the above-mentioned target material comprise Sb, and $AgInTe_2$ with a stoichiometric composition and/or a nearly stoichiometric composition having a chalcopyrite structure and/or zincblende structure. In addition, it is preferable that the above-mentioned $AgInTe_2$ crystallites have a particle size (d) of 450 Å or less.

When a recording layer for the optical recording medium is deposited in a thin film by sputtering by use of the aforementioned target, and the thus deposited recording layer is then subjected to proper heat treatment for initialization, the phase-change recording material with Ag—In—Sb—Te system for use in the recording layer can assume a mixed phase, namely, a crystalline phase comprising $AgSbTe_2$ and an amorphous phase comprising In and Sb, as reported in "Proceedings of the 3rd Symposium on Phase-Change Recording" p. 102 (1991), and "Japanese Journal of Applied Physics" vol. 32 (1993) pp. 5241–5247. When the mixed phase is formed in the phase-change recording material, it means that an amorphous phase comprising at least In and Sb is dispersed in a fine crystalline phase comprising $AgSbTe_2$ with a stoichiometric composition and/or a nearly stoichiometric composition, and/or the crystalline $AgSbTe_2$ phase is dispersed in the amorphous phase of In and Sb. Anyway, since such a mixed phase of the phase-change recording material can be regarded as a non-recorded state, the thus obtained optical recording medium can be provided with high erasability, and is capable of repeatedly carrying out the recording operation and the erasing operation by the application of a low power.

The above-mentioned mixed phase can be prepared in the recording layer because the target material of the sputtering target for fabricating the recording layer is a combination of $AgInTe_2$ and Sb. When the recording layer is deposited, the phase-change recording material for use in the recording layer is considered to initially comprise the $AgInTe_2$ amorphous phase and the Sb amorphous phase. Thereafter, when the recording layer is initialized by the application of laser power or thermal energy thereto, the $AgInTe_2$ amorphous phase in the recording layer disappeared and changed into the $AgSbTe_2$ crystalline phase. Thus, there can be formed in the recording layer a mixed phase comprising the crystalline phase of $AgSbTe_2$ with a stoichiometric and/or nearly stoichiometric composition and an amorphous phase comprising In and Sb. In other words, by the process of initializing, the Ag—In—Te—Sb based recording layer undergoes the substitution reaction, thereby inducing a structural change therein.

The particle size of the $AgInTe_2$ crystallites for use in the target material can be obtained by calculation, for instance, in accordance with the Scherrer equation, from the width of a main peak which is obtained from the X-ray diffraction of the pulverized target. For instance, when Cu is employed for the source of X-ray and $\lambda$ is about 1.54 Å, the width of the main peak is about 24.1°. It is necessary that the width of the peak be corrected with reference to the main peak of a reference sample with a sufficiently large particle size. In the case where the particle size of the $AgInTe_2$ crystallites in the sputtering target is 450 Å or less, it is possible to readily cause the recording layer to assume the previously mentioned mixed phase by subjecting the recording layer to appropriate heat treatment after deposition thereof, thereby performing stable recording and erasing operations.

To obtain the above-mentioned target for sputtering, a mixture of Ag, In and Te elements is fused at a temperature in the range of 550° C. to 850° C., rapidly cooled to prepare a solid lump, and pulverized to prepare finely-divided particles. The thus prepared finely-divided particles are mixed with Sb, and the mixture of the finely-divided particles and Sb is then sintered. Alternatively, a mixture of Ag, In, Te and Sb elements is fused at a temperature in the range of 550° C. to 850° C., rapidly cooled and pulverized, and then the thus obtained finely-divided particles are sintered.

In any case, it is advantageous to subject the above-mentioned mixture, that is, the mixture of the finely-divided particles of Ag, In and Te elements and Sb, or the mixture of the finely-divided particles of Ag, In, Te and Sb elements, to heat treatment prior to the sintering step. The heat treatment may be carried out at a temperature not higher than the melting point of the mixture.

The optical recording medium according to the present invention comprises a recording layer comprising a phase-change recording material, capable of recording and erasing information by utilizing changes in the phase of the phase-change recording material in the recording layer, the recording material comprising as constituent elements Ag, In, Te and Sb with the respective atomic percents of $\alpha$, $\beta$, $\gamma$ and $\delta$ thereof being in the relationship of $1 \leq \alpha < 6$, $7 \leq \beta \leq 20$, $20 \leq \gamma \leq 35$, $35 \leq \delta \leq 70$, and $\alpha+\beta+\gamma+\delta=100$.

Due to the phase-change recording material of a quaternary system of Ag—In—Te—Sb, the above-mentioned optical recording medium of the present invention exhibits high recording sensitivity and speed, that is, excellent phase change from a crystalline phase to an amorphous phase; high erasing sensitivity and speed, that is, excellent phase change from an amorphous phase to a crystalline phase; and high erasability. To obtain the most satisfactory recording and erasing characteristics, it is preferable that the phase-change recording material for use in the optical recording medium comprise $AgSbTe_2$ in a crystalline phase when no information is recorded in the recording layer and after information is erased therefrom.

In the present invention, the composition of the recording layer for use in the phase-change optical recording medium is measured based on the emission spectroscopic analysis. Not only the emission spectroscopic analysis, but also X-ray microanalysis, Rutherford back scattering, Auger electron spectroscopic analysis, and X-ray fluorescence analysis can be employed to measure the composition of the recording layer. In such a case, however, it is necessary to correct the obtained composition with reference to the composition obtained by the emission spectroscopic analysis. The composition of the recording layer specified in the present invention is the average one.

The X-ray diffraction or electron diffraction is appropriate for the observation of the condition of the recording layer. Namely, when a spot pattern or Debye-Scherrer ring pattern is observed in the recording layer by the electron diffraction, the recording layer is considered to assume a crystalline state; while a ring pattern or halo pattern is observed therein, the recording layer is considered to assume an amorphous state.

Further, the chemical bonding of the constituent elements in the recording layer, for example, the chemical bonding of an oxide or nitride existing in the recording layer can be efficiently analyzed by the FT-IR or XPS.

From the aspect of structure of the optical recording medium, it is preferable that the optical recording medium comprise a substrate in the form of a disk, and a first heat-resistant protective layer, the previously mentioned recording layer, a second heat-resistant protective layer and a reflective heat dissipation layer comprising a metal or an alloy, which are successively overlaid on the substrate in this order.

The thickness of the recording layer deposited by use of the previously mentioned sputtering target is preferably in the range of 100 to 1000 Å, more preferably in the range of 150 to 700 Å. When the thickness of the recording layer is in the range of 100 to 1000 Å, sufficient light absorbing capability of the recording layer can be maintained, and the phase change can uniformly and speedily take place in the recording layer.

Figure 13:
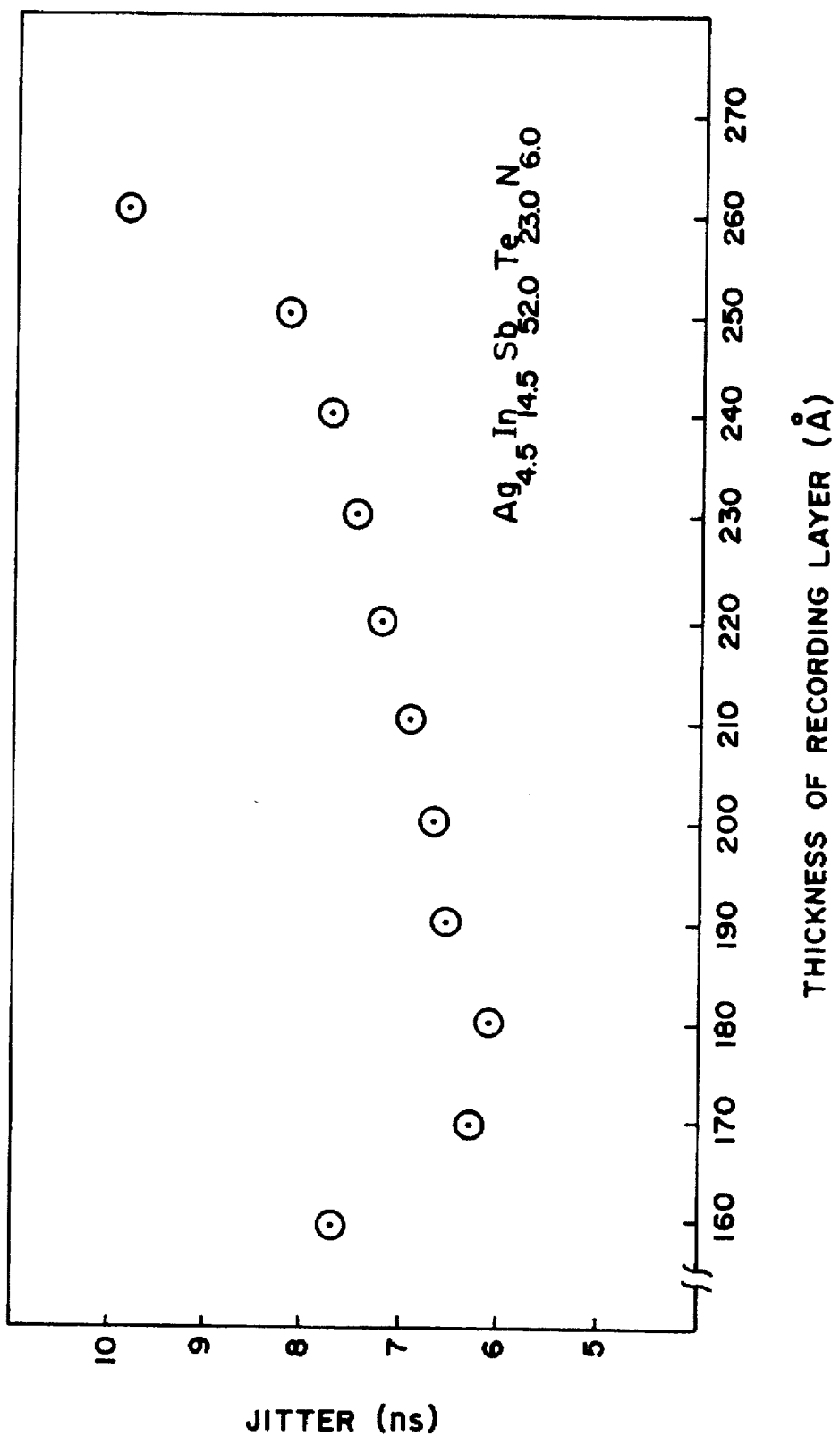
FIG. 13 is a graph which shows the relationship between the thickness of the recording layer and the jitter value.

Furthermore, when the jitter value is taken into consideration, the most preferable thickness of the recording layer is in the range of 170 to 250 Å, as shown in FIG. 13. In FIG. 13, the composition of the recording layer is represented by the formula of

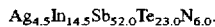

$Ag_{4.5}In_{14.5}Sb_{52.0}Te_{23.0}N_{6.0}$.

According to the present invention, the recording layer for the optical recording medium can be formed by sputtering the previously mentioned target of the present invention in an atmosphere of argon gas, with nitrogen gas being contained therein with a concentration of 0 to 10 mol %. According to the concentration of the nitrogen gas in the atmosphere during the sputtering step, the composition of the obtained recording layer can be optimumly adjusted so as to be fitted to the desired disk rotation speed, the structure of layers of the recording disk, and the operating conditions of the recording disk for practical use. By use of a mixed gas of nitrogen gas and argon gas in the course of sputtering, the recording and erasing repetition reliability of the obtained recording medium is improved.

The mixed gas for use in the sputtering step may be prepared by mixing nitrogen gas and argon gas at a predetermined mixing ratio before introduced into a sputter chamber. Alternatively, the argon gas and the nitrogen gas are introduced into the sputter chamber with the respective flow rates being controlled so as to obtain a desired molar ratio.

In this case, it is desirable that the partial pressure of the nitrogen gas $(P_N)$ be set in the range of $1\times10^{-5} Torr \leq (P_N) \leq 8\times10^{-5} Torr$ when the nitrogen gas is contained in the atmosphere during the sputtering step.

It is also desirable that the back pressure (p) applied prior to the sputtering step be set in the range of $3\times10^{-7} \leq (p) \leq 5\times10^{-6}$ Torr. When the back pressure (p) is set so as to satisfy the above-mentioned relationship of $3\times10^{-7} \leq (p) \leq 5\times10^{-6}$ Torr, the amorphous phase comprising $AgInTe_2$ and Sb in the phase-change recording material can be readily changed into the mixed phase of the crystalline phase of $AgSbTe_2$ and the In-Sb amorphous phase in the recording layer by some heat treatment after deposition of the recording layer.

Further, it is advantageous that a mixed gas comprising argon gas and nitrogen gas with the concentration of the nitrogen gas being higher than that in the atmosphere during the sputtering step be introduced into the atmosphere after the sputtering step.

When the concentration of the nitrogen gas in the atmosphere is 10 mol % or less in the course of the sputtering step, the disk characteristics of the obtained optical recording medium are excellent. To be more specific, not only the increase of the maximum number of repeated overwriting operations, but also the modulation degree and the shelf life of a recorded mark (amorphous mark) can be improved. The mechanism of improvement in such disk characteristics caused by the addition of a proper amount of nitrogen to the recording layer has not been clarified, but it is supposed that when a proper amount of nitrogen is contained in the recording layer, the density of the recording layer is decreased and voids are increased, whereby the randomness of the recording layer is increased in terms of the configuration. As a result, the degree of order in the recording layer is moderated when compared with the case where no nitrogen is added to the recording layer. Therefore, the transition from the amorphous phase to the crystalline phase tends to be restrained, so that the stability of the amorphous mark is increased and the shelf life of the amorphous mark is improved. Furthermore, one of the advantages obtained by the addition of nitrogen to the recording layer is that the linear speed of the obtained optical recording medium can be controlled. To be more specific, the optimum linear speed of disk rotation can be lowered by the addition of nitrogen to the recording layer. Even though the composition of the target is identical, the optimum linear speed of the phase-change optical recording disk can be controlled simply by adjusting the mixing ratio of nitrogen gas to argon gas introduced into the atmosphere during the sputtering step.

Figure 7:
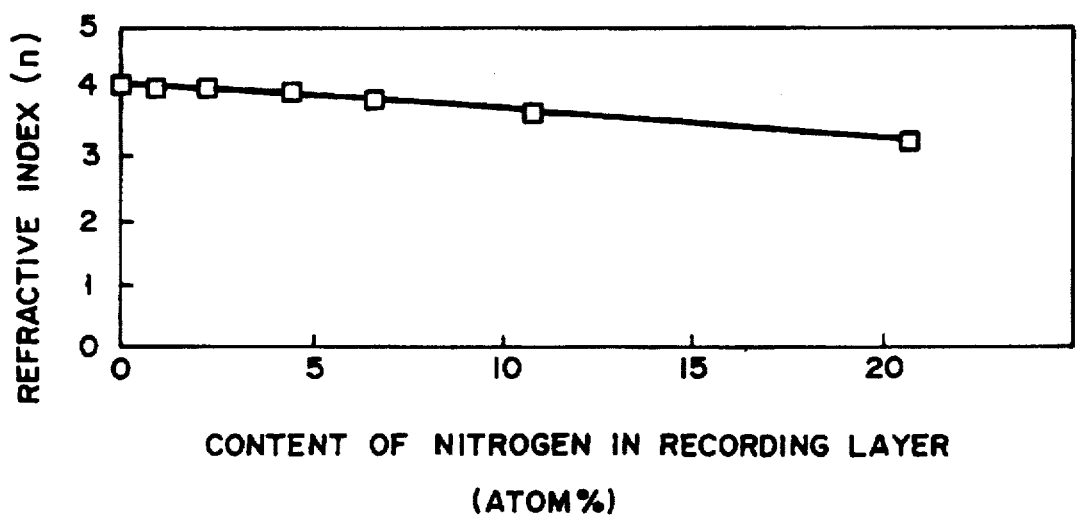
FIG. 7 is a graph which shows the relationship between the content of nitrogen in a recording layer of an optical recording medium and the refractive index (n) of the recording layer.
Figure 8:
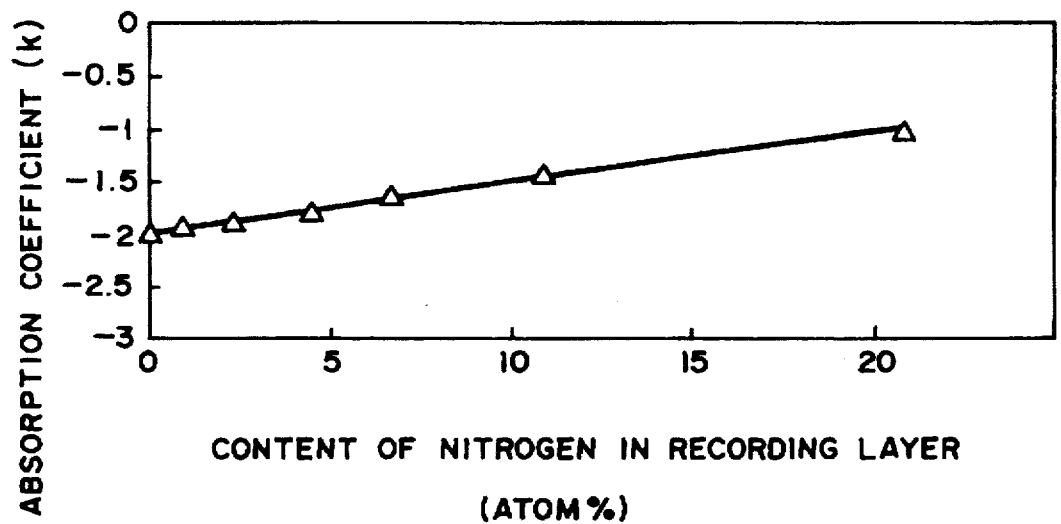
FIG. 8 is a graph which shows the relationship between the content of nitrogen in a recording layer of an optical recording medium and the absorption coefficient (k) of the recording layer.
Figure 9:
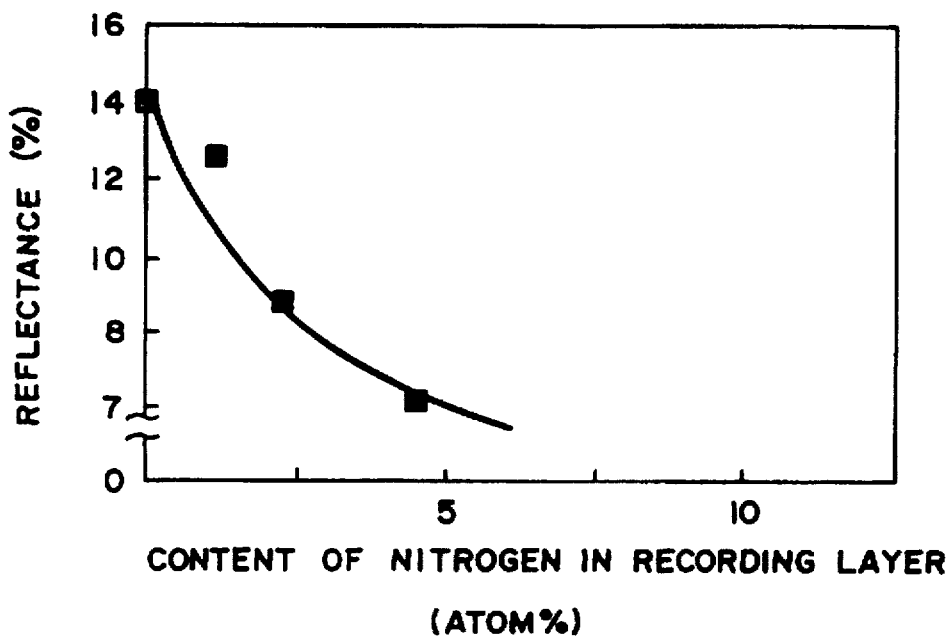
FIG. 9 is a graph which shows the relationship between the content of nitrogen in a recording layer of an optical recording medium and the reflectance of the recording layer.
Figure 10:
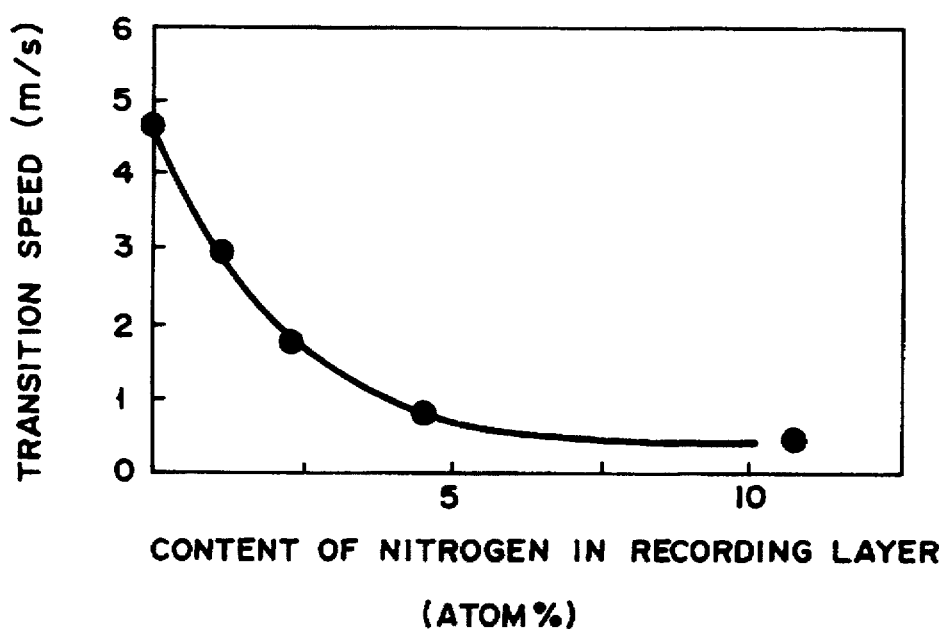
FIG. 10 is a graph which shows the relationship between the content of nitrogen in a recording layer of an optical recording medium and the transition speed from the crystalline phase to the amorphous phase of the recording layer.

When the content of nitrogen in the recording layer is increased, the refractive index (n) of the recording layer is decreased and the absorption coefficient (k) thereof is increased, as respectively shown in FIGS. 7 and 8. As a result, the reflectance of the obtained recording medium is greatly changed, as shown in FIG. 9. In addition, the -transition speed from the crystalline phase to the amorphous phase is lowered as the content of nitrogen in the recording layer is increased, as shown in FIG. 10.

The recording layer of the optical recording medium according to the present invention may further comprise a nitride and/or oxide comprising at least one of the constituent elements Ag, In, Te and Sb.

In particular, when the nitride comprises Te, for example, with a Te—N or Sb—Te—N bond in the recording layer, the maximum number of repeated overwriting operations can be effectively increased. Such chemical bonding in the recording layer can be analyzed by the FT-IR or XPS, as previously mentioned. For instance, a Te—N bond gives rise to peaks in the 500 to 600 $cm^{-1}$ region; and absorptions arising from an Sb—Te—N bond occur in the 600 to 650 $cm^{-1}$ region by the FT-IR analysis.

In the present invention, the recording layer for use in the phase-change optical recording medium may further comprise other elements and impurities for the purpose of still more improvement of the performance and increase of the reliability. For instance, elements as disclosed in Japanese Patent Application 4-1488, that is, B, N, C, P and Si; and other elements such as O, S, Se, Al, Ti, V, Mn, Fe, Co, Ni, Cu, Zn, Ga, Sn, Pd, Pt and Au may be contained in the recording layer.

With respect to the influence of oxygen atom in the recording layer, the more the content of oxygen in the recording layer, the smaller the refractive index (n) of the recording layer and the larger the absorption coefficient (k) thereof. In addition, the transition speed from the crystalline phase to the amorphous phase is lowered. However, unlike the nitrogen atom, the oxygen atom has an adverse effect on the life of the recording medium and overwriting repetition properties when the content of the oxygen in the recording layer is excessively increased.

Particularly, when a substrate is made of a plastic material such as polycarbonate resin, it is recommendable to carry out the following steps prior to the provision of the recording layer in order to control the content of oxygen atom in the recording layer to be provided on the substrate:

(1) Prior to the formation of a recording layer on the plastic substrate, the substrate is subjected to baking at 60° C. or more and atmospheric pressure to remove the water content from the plastic substrate.

The moisture absorption of the substrate made of a plastic material such as a polycarbonate resin is so high that the plastic substrate takes up water even when the substrate is allowed to stand for several tens of minutes after preparation by injection molding. If the substrate is placed in the sputter chamber as it is in order to provide a recording layer thereon by sputtering process, oxygen is generated from the water content in the substrate, and incorporated in the recording layer to be deposited. Therefore, it is preferable that the substrate be subjected to baking at atmospheric pressure for dehydration before placed in the sputter chamber.

Figure 11:
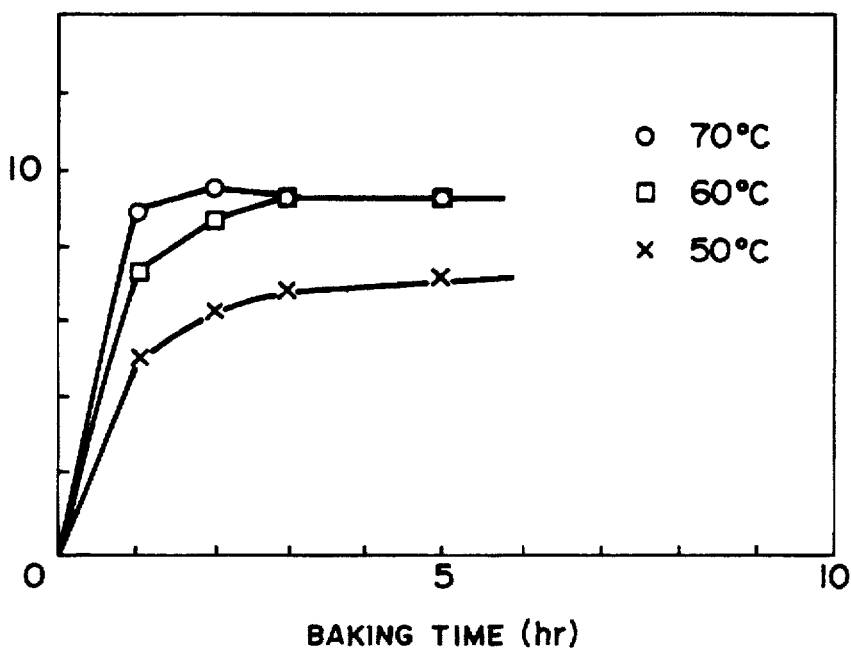
FIG. 11 is a graph which shows the relationship between the baking time of a substrate and the water content which can be removed from the substrate.

FIG. 11 is a graph which shows the relationship between the baking time and the water content removed from a polycarbonate substrate. As can be seen from the graph of FIG. 11, it is effective to carry out the baking of the substrate at 60° C. or more.

(2) Prior to the formation of a recording layer on the plastic substrate, the substrate is allowed to stand in a vacuum chamber for 30 minutes or more to remove the water content from the plastic substrate.

Figure 12:
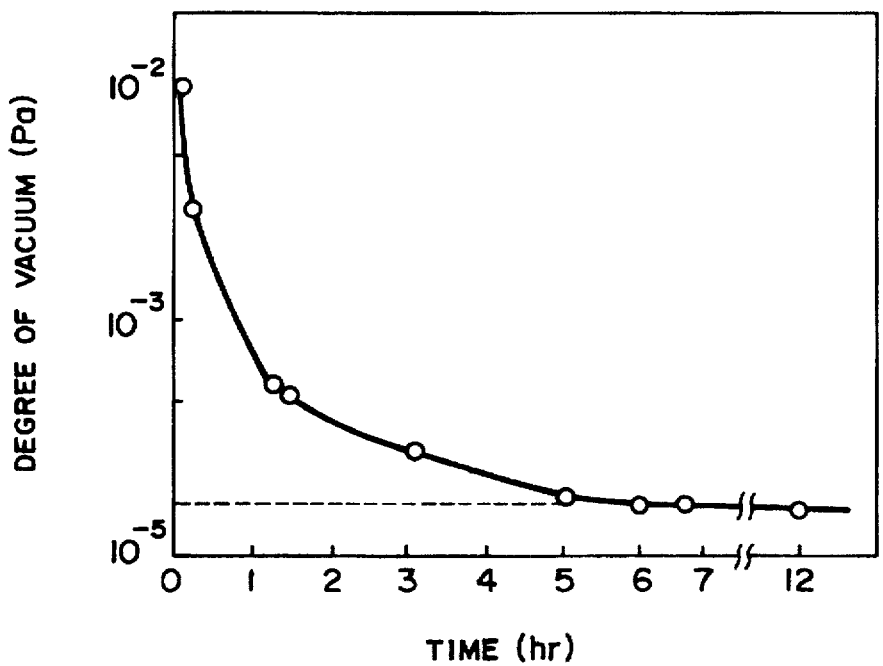
FIG. 12 is a graph which shows the relationship between the period of time when a substrate is allowed to stand in a vacuum chamber and the degree of vacuum in the vacuum chamber.

FIG. 12 is a graph which shows the relationship between the period of time when the substrate is allowed to stand in the vacuum chamber and the degree of vacuum in the vacuum chamber. As is apparent from the graph, it is effective to allow the substrate to stand in the vacuum chamber for 30 minutes or more.

(3) Prior to the formation of a recording layer on the plastic substrate, the substrate is subjected to etching by sputtering to remove the water content from the plastic substrate, thereby preventing the recording layer to be deposited thereon from being contaminated by large amounts of oxygen atom.

It is preferable to carry out the etching of the plastic substrate in an atmosphere comprising at least argon gas or nitrogen gas at a pressure of $1 \times 10^{-1}$ to $8 \times 10^{-1}$ Pa.

The present invention will now be explained in detail with reference to FIG. 1.

FIG. 1 is a schematic cross-sectional view showing the layer structure of the phase-change optical recording medium according to the present invention. As shown in FIG. 1, a first heat-resistant protective layer 2, a recording layer 3, a second heat-resistant protective layer 4 and a reflective heat dissipation layer 5 are successively overlaid on a substrate 1. It is not always necessary to provide both of the first and second heat-resistant protective layers 2 and 4. However, it is desirable to provide the first protective layer 2 when a material with low heat resistance, such as polycarbonate resin, is employed for the substrate 1.

In the present invention, glass, ceramic materials and resins are usable as the materials for the substrate 1 of the optical recording medium. In particular, the resin substrate is advantageous from the viewpoints of manufacturing cost and molding facility of a pregroove.

Examples of the resin as the material for the substrate 1 include polycarbonate (PC) resin, polymethyl methacrylate (PMMA) resin, amorphous polyolefin (APO) resin, acrylic resin, epoxy resin, polystyrene resin, acrylonitrile—styrene copolymer resin, polyethylene resin, polypropylene resin, silicone resin, fluoroplastics, ABS resin and urethane resin. Of those resins, the polycarbonate resin is the most practical material for the substrate 1 because of its good processability and optical properties. The substrate may be prepared in the form of a disk, card or sheet.

When the phase-change optical recording medium of the present invention is applied to a rewritable compact disk (CD-Erasable), it is desirable that the substrate 1 bear a guide groove with a width (half width) of 0.25 to 0.65 μm, preferably 0.30 to 0.55 μm, and a depth of 250 to 650 Å, preferably 300 to 550 Å.

When the optical recording medium of the present invention is constructed with such layered structure as shown in FIG. 1, and the disk-shaped substrate bears the above-mentioned guide groove, there can be provided a rewritable compact disk with excellent compatibility.

With respect to the groove signal characteristics of the compact disk, the push-pull magnitude after recording (PPm) is prescribed by the Orange Book. According to the Orange Book, the push-pull magnitude after recording (PPm) of the compact disk is in the range of 0.04 to 0.15, preferably 0.04 to 0.12, and more preferably 0.04 to 0.09. It is very difficult for the conventional phase-change rewritable compact disk to meet both of the overall requirements for the recording and reproducing operations, and the above-mentioned requirements of the groove signal characteristics. By using the phase-change optical recording medium of the present invention, however, a rewritable compact disk capable of satisfying both requirements can be provided.

The first and second heat-resistant protective layers 2 and 4 are provided to protect the recording layer 3 from water and oxygen. Therefore, it is preferable that the materials for use in the first and second heat-resistant protective layers 2 and 4 have high corrosion resistance, low reactivity with the recording layer 3, and good adhesion to the substrate 1 and the recording layer 3.

Specific examples of the material for use in the first and second heat-resistant protective layers 2 and 4 are metallic oxides such as SiO, $SiO_2$, ZnO, $SnO_2$, $Al_2O_3$, $TiO_2$, $In_2O_3$, MgO, and $ZrO_2$; nitrides such as SiN, $Si_3N_4$, SiON, SiBN, SiBON, AlN, TiN, BN and ZrN; sulfides such as ZnS, $In_2S_3$ and $TaS_4$; carbides such as SiC, $TaC_4$, $B_4C$, WC, TiC and ZrC; carbon with a diamond structure; and mixtures thereof, as disclosed in Japanese Patent Publication 4-74785. Further, those heat-resistant protective layers may further comprise an impurity when necessary as long as the melting points of the first and second protective layers 2 and 4 are higher than that of the recording layer 3.

The first and second heat-resistant protective layers 2 and 4 for use in the present invention can be provided by vacuum deposition, sputtering, plasma chemical vapor deposition, photochemical vapor deposition, ion plating or electron beam deposition method.

It is preferable that the thickness of the first heat-resistant protective layer 2 be in the range of 500 to 2500 Å, more preferably in the range of 1200 to 2300 Å. When the thickness of the first heat-resistant protective layer 2 is within the range of 500 to 2500 Å, the first protective layer 2 can carry out its function, and the decrease of sensitivity can be prevented, and the peeling of the protective layer 2 does not easily take place. When necessary, the first heat-resistant protective layer 2 may be of a multi-layered type.

It is preferable that the thickness of the second heat-resistant protective layer 4 be in the range of 100 to 1500 Å, more preferably in the range of 150 to 1000 Å. When the thickness of the second heat-resistant protective layer 4 is within the range of 100 to 1500 Å, not only the second protective layer 4 can carry out its function, but also the peeling of the second protective layer 4 can be prevented and the decrease of the repetition recording properties can be prevented even though the recording medium is rotated at a so-called low linear speed, that is, in the range of 1.2 to 5.6 m/s. The second heat-resistant protective layer 4 may also be of a multi-layered type.

The provision of the reflective heat dissipation layer 5 is not always necessary, but is desirable because the thermal energy excessively accumulated during the recording and/or erasing operations can be dissipated by the reflective heat dissipation layer 5, thereby reducing the thermal damage applied to the recording medium itself.

In view of the functions of the reflective heat dissipation layer 5, the materials with high reflectance and a relatively high thermal conductivity may be employed.

Specific examples of the material for the reflective heat dissipation layer 5 include metals such as Al, Au, Ag and Cu; and alloys thereof.

The reflective heat dissipation layer 5 can be provided by vacuum deposition, sputtering, plasma chemical vapor deposition, photochemical vapor deposition, ion-plating or electron beam deposition method.

It is preferable that the thickness of the reflective heat dissipation 5 be in the range of 300 to 2000 Å, more preferably in the range of 500 to 1500 Å.

Furthermore, the optical recording medium of the present invention may further comprise an overcoat layer, for example, an ultraviolet-curing resin layer, which is provided on the reflective heat dissipation layer 5. Those layers may be laminated with an adhesive.

As the electro-magnetic waves for use in the present invention, which are used for initializing the obtained recording layer, and carrying out the recording, reproducing and erasing operations, there can be employed laser beams, electron rays, X-rays, ultraviolet rays, visible rays, infrared rays, and microwave. In particular, the semiconductor laser beam is most applicable as the electro-magnetic wave for use in the recording, reproducing and erasing operations because a system for driving the optical recording medium can be made compact.

The optical recording operation can be satisfactorily performed by applying a semiconductor laser beam to the previously mentioned optical recording medium, with the optical recording medium being rotated at a linear speed of 1.2 to 5.6 m/s.

Other features of this invention will become apparent in the course of the following description of exemplary embodiments, which are given for illustration of the invention and are not intended to be limiting thereof.

EXAMPLES 1 TO 8 AND COMPARATIVE EXAMPLES 1 TO 10

A 2000 Å thick first heat-resistant protective layer of $ZnO \cdot SiO_2$ was provided on a polycarbonate substrate with a thickness of 1.2 mm bearing thereon a guide groove having a width of 0.5 µm, a depth of 600 Å and a track pitch of 1.6 µm.

On the first heat-resistant protective layer, a recording layer with a thickness of 250 Å was formed by sputtering by use of a target as shown in Table 1.

Further, a 300 Å thick second heat-resistant protective layer of $ZnS \cdot SiO_2$, a 1000 Å thick reflective heat dissipation layer made of an aluminum alloy comprising Si in an amount of 1.0 wt. %, and a 10 µm thick overcoat layer comprising an ultraviolet-curing resin were successively overlaid on the recording layer.

Table 1 shows the composition of a sputtering target for fabricating each recording layer, which comprises Sb, and $AgInTe_2$ with a stoichiometric composition and/or a nearly stoichiometric composition having a chalcopyrite structure and/or zincblende structure; and the composition of the obtained recording layer.

The recording layer was formed on the first heat-resistant protective layer by sputtering under such conditions that the back pressure applied prior to the sputtering process was set at $9 \times 10^{-7}$ Torr, and then adjusted to $4 \times 10^{-3}$ Torr during the sputtering process by introducing argon gas into the sputter chamber, and the $RF_{power}$ was set at 40 W.

Thus, disk-shaped optical recording media Nos. 1 to 8 according to the present invention and comparative disk-shaped optical recording media Nos. 1 to 10 were fabricated.

The disk characteristics of each of the above-mentioned phase-change optical recording media Nos. 1 to 8 according to the present invention and comparative phase-change optical recording media Nos. 1 to 10 were evaluated by recording a mark and reproducing the recorded mark at such an optimal disk rotation speed within a range of 1.2 to 5.6 m/s as to obtain a maximum C/N ratio. The wavelength of the semiconductor laser beam was 780 nm, and Numerical Aperture (NA) value of the objective lens was 0.5.

The signals were modulated in accordance with an Eight to Fourteen Modulation (EFM) system, and multi-pulse patterns were employed.

As a result of the above-mentioned evaluations, the disk characteristics of each recording medium were assessed in accordance with the following scale:

Level 3

Excellent disk characteristics.

$C/N \geq 55$ dB, and erasability $(Ers) \leq -35$ dB.

Level 2

Good disk characteristics.

$55 > C/N \geq 45$ dB, and $-35 < (Ers) \leq -25$ dB.

Level 1

Poor disk characteristics.

$C/N < 45$ dB, and $(Ers) > -25$ dB.

The results of the disk characteristics are shown in Table 1.

In addition, the maximum number of repeated overwriting operations was measured to evaluate the overwriting characteristics. The results are also shown in Table 1.

TABLE 1

| | Composition of Sputtering Target | | | | Composition of Recording Layer | | | | Level of Disk Character- | Maximum Number of Repeated Overwriting |
| --- | --- | --- | --- | --- | --- | --- | --- | --- | --- | --- |
| | Ag (at. %) | In (at. %) | Te (at. %) | Sb (at. %) | Ag (at. %) | In (at. %) | Te (at. %) | Sb (at. %) | istics | Operations |
| Ex. 1 | 4.0 | 15.0 | 25.0 | 56.0 | 2.0 | 13.0 | 24.0 | 61.0 | 3 | 12,000 |
| Ex. 2 | 4.0 | 11.0 | 28.0 | 57.0 | 4.0 | 12.0 | 27.0 | 57.0 | 3 | 15,000 |
| Ex. 3 | 7.0 | 11.0 | 22.0 | 60.0 | 5.5 | 9.0 | 21.0 | 64.5 | 3 | 7,000 |
| Ex. 4 | 1.5 | 10.0 | 28.0 | 60.5 | 2.0 | 11.0 | 28.0 | 59.0 | 3 | 8,000 |

TABLE 1-continued

|  | Composition of Sputtering Target | | | | Composition of Recording Layer | | | | Level of Disk Character-istics | Maximum Number of Repeated Overwriting Operations |
|---|---|---|---|---|---|---|---|---|---|---|
|  | Ag (at. %) | In (at. %) | Te (at. %) | Sb (at. %) | Ag (at. %) | In (at. %) | Te (at. %) | Sb (at. %) |  |  |
| Ex. 5 | 3.0 | 8.0 | 19.0 | 70.0 | 1.0 | 7.0 | 22.0 | 70.0 | 3 | 10,000 |
| Ex. 6 | 0.7 | 5.0 | 30.0 | 64.3 | 1.0 | 7.0 | 28.0 | 64.0 | 2 | 8,000 |
| Ex. 7 | 4.0 | 8.0 | 23.0 | 65.0 | 2.0 | 7.0 | 21.0 | 70.0 | 2 | 10,000 |
| Ex. 8 | 6.0 | 21.0 | 20.0 | 53.0 | 4.0 | 19.0 | 20.0 | 57.0 | 2 | 13,000 |
| Comp. Ex. 1 | 1.0 | 10.0 | 15.0 | 74.0 | 1.0 | 10.0 | 13.0 | 76.0 | 1 | $\leq 200$ |
| Comp. Ex. 2 | 2.0 | 3.0 | 10.0 | 85.0 | 1.5 | 4.0 | 8.0 | 86.5 | 1 | $\leq 200$ |
| Comp. Ex. 3 | 8.0 | 20.0 | 55.0 | 17.0 | 11.0 | 17.0 | 63.0 | 9.0 | 1 | $\leq 200$ |
| Comp. Ex. 4 | 10.0 | 1.0 | 40.0 | 49.0 | 7.0 | 0.1 | 37.0 | 55.9 | 1 | $\leq 200$ |
| Comp. Ex. 5 | 11.0 | 9.0 | 30.0 | 50.0 | 8.0 | 7.0 | 26.0 | 59.0 | 1 | $\leq 200$ |
| Comp. Ex. 6 | 15.0 | 6.0 | 5.0 | 74.0 | 13.0 | 5.0 | 4.0 | 78.0 | 1 | $\leq 200$ |
| Comp. Ex. 7 | 27.0 | 23.0 | 40.0 | 10.0 | 20.0 | 31.0 | 45.0 | 4.0 | 1 | $\leq 200$ |
| Comp. Ex. 8 | 27.0 | 8.0 | 25.0 | 40.0 | 32.0 | 5.0 | 25.0 | 38.0 | 1 | $\leq 200$ |
| Comp. Ex. 9 | 10.0 | 15.0 | 28.0 | 47.0 | 7.0 | 13.0 | 26.0 | 54.0 | 3 | $\leq 500$ |
| Comp. Ex. 10 | 11.0 | 11.0 | 22.0 | 56.0 | 8.0 | 9.0 | 21.0 | 62.0 | 3 | $\leq 500$ |

As can be seen from the results shown in Table 1. the disk characteristics of the optical recording medium are satisfactory when the sputtering target for fabricating the recording layer comprises a target material comprising as constituent elements Ag. In. Te and Sb. with the respective atomic percents of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\alpha + \beta + \gamma + \delta = 100$, and the composition of the obtained recording layer satisfies the relationship of $1 \leq \alpha < 6$, $7 \leq \beta \leq 20$, $20 \leq \gamma \leq 35$, $35 \leq \delta \leq 70$, and $\alpha + \beta + \gamma + \delta = 100$.

Each sputtering target for fabricating the recording layer employed in Examples 1 to 8 was produced by fusing the constituent elements of Ag. In. Te and Sb to prepare a fused mixture, rapidly cooling the fused mixture to prepare a solid lump, pulverizing the solid lump to prepare finely-divided particles, subjecting the particles to heat treatment, and sintering the finely-divided particles.

Figure 2:
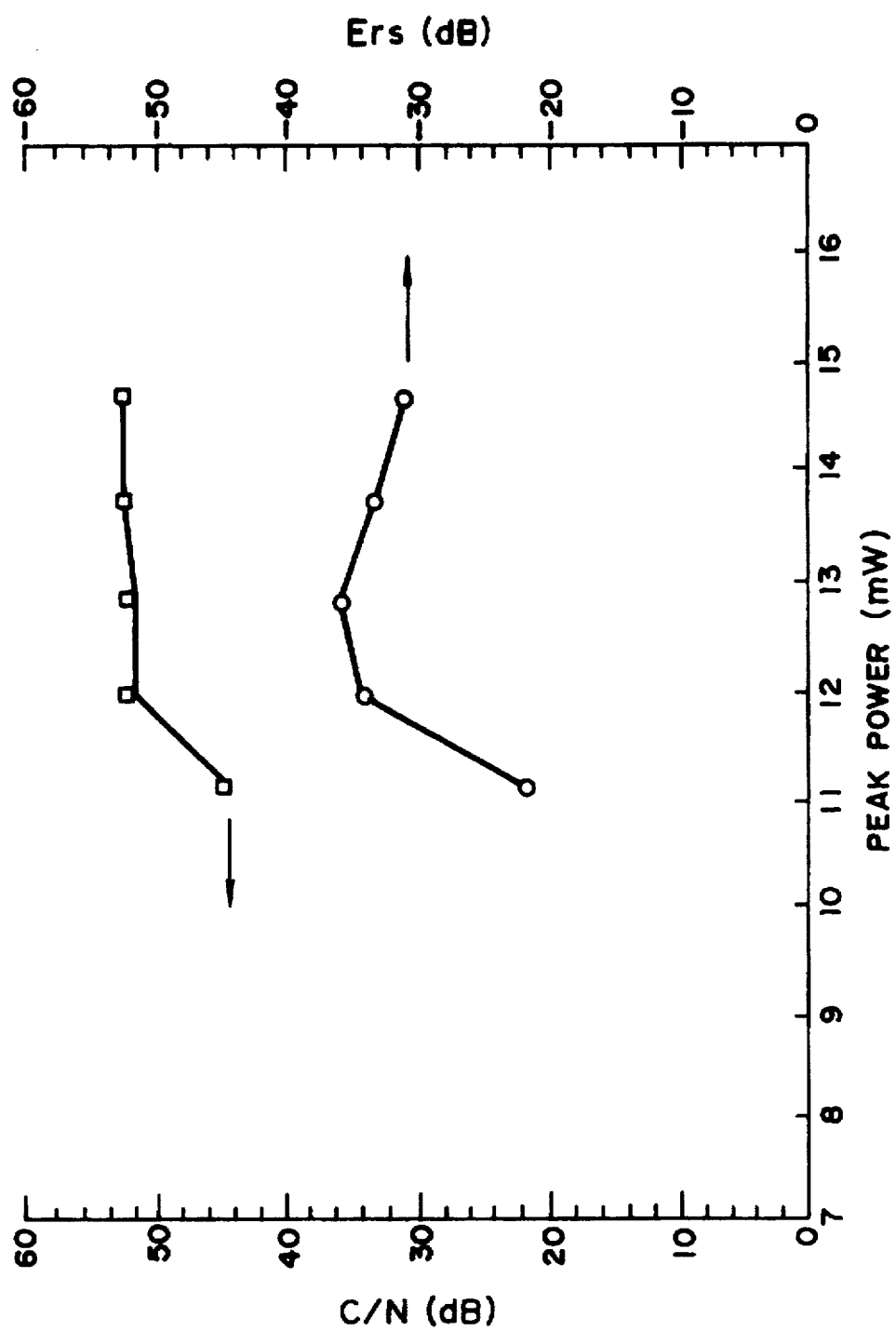
FIG. 2 is a graph which shows the overwriting characteristics of a recording layer of an optical recording medium according to the present invention, which recording layer is fabricated from a sputtering target produced by the method including the heat treatment step.

FIG. 2 is a graph which shows the overwriting characteristics of the optical recording medium No. 5 fabricated in Example 5 when the overwriting operation was carried out at a linear speed of 5 m/sec.

EXAMPLE 9

The procedure for fabricating the disk-shaped optical recording medium No. 5 in Example 5 was repeated except that the method of producing the target for fabricating the recording layer of the recording medium No. 5 in Example 5 did not include the heat treatment step prior to the sintering step. Thus, a disk-shaped optical recording medium No. 9 according to the present invention was fabricated.

The overwriting characteristics of the optical recording medium No. 9 were evaluated at a linear speed of 5 m/sec in the same manner as in Example 5.

Figure 3:
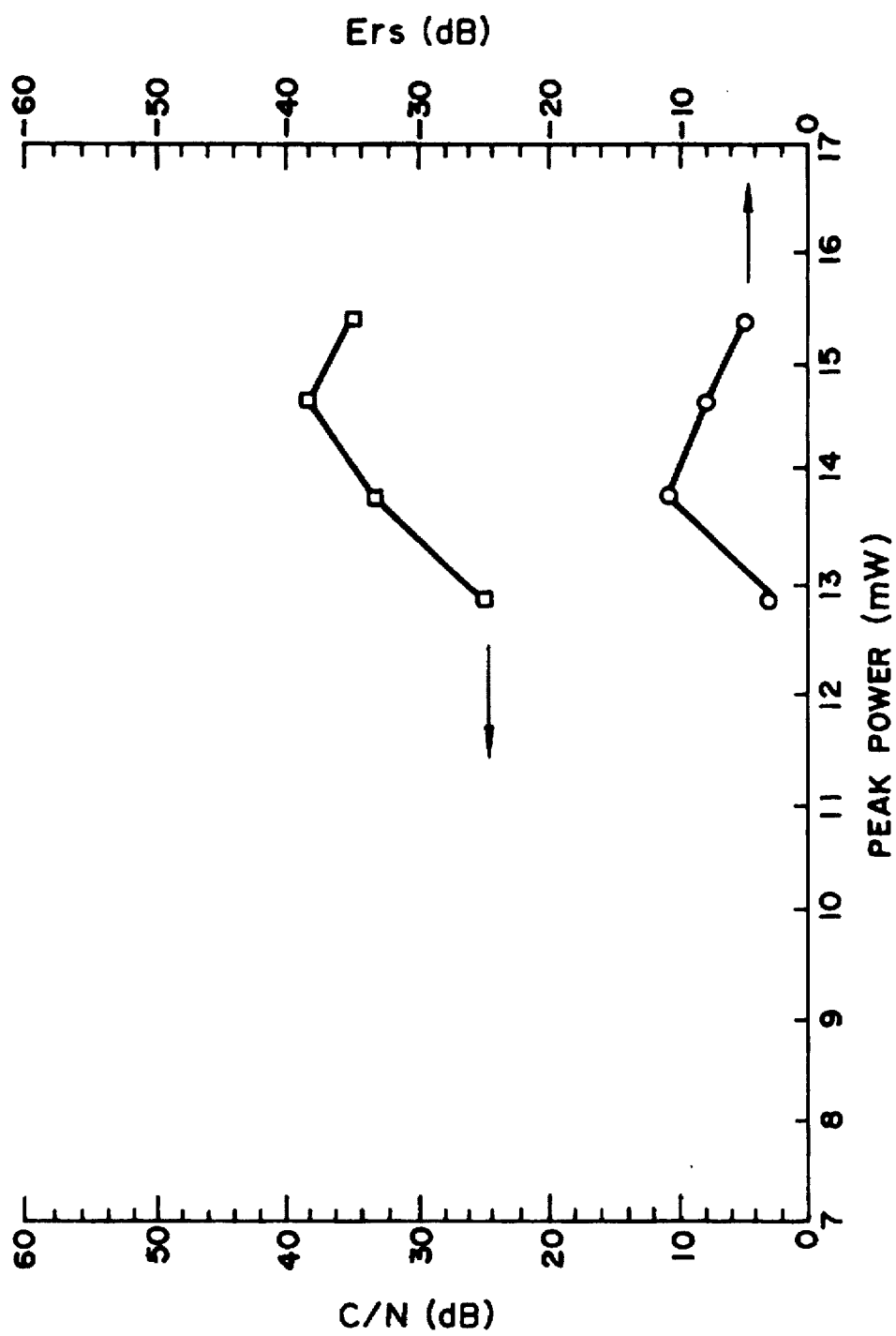
FIG. 3 is a graph which shows the overwriting characteristics of a recording layer of an optical recording medium according to the present invention, which recording layer is fabricated from a sputtering target produced by the method not including the heat treatment step.

FIG. 3 is a graph which shows the overwriting characteristics of the optical recording medium No. 9.

In comparison with the graph of FIG. 3, the optical recording medium No. 5 is superior to the recording medium No. 9 with respect to the disk characteristics, such as the C/N ratio and the erasability, and the overwriting sensitivity.

EXAMPLES 10 to 12

The procedure for fabricating the disk-shaped optical recording medium No. 3 in Example 3 was repeated except that nitrogen gas was contained in the atmosphere with concentrations of 3.0, 6.0, and 10.0 mol %, respectively in Example 10, Example 11, and Example 12 when the recording layer was formed on the first heat-resistant protective layer by sputtering.

Thus, disk-shaped optical recording media Nos. 10 to 12 according to the present invention were fabricated.

Table 2 shows the composition of each of the thus obtained recording layers in terms of the atomic percents of constituent elements.

In the same manner as in Example 1, each of the optical recording media Nos. 3, 10, 11 and 12 according to the present invention was repeatedly subjected to the overwriting operation, and the maximum number of the repeated overwriting operations was obtained.

The results are also shown in Table 2.

TABLE 2

| Example No. | $N_2/(Ar + N_2)$ (mol %) | Composition of Recording Layer (atom. %) | | | | Optimal Recording Sensitivity (mW) *1) | Maximum Number of Repeated Overwriting Operations *2) |
|---|---|---|---|---|---|---|---|
|  |  | Ag | In | Te | Sb |  |  |
| Ex. 3 | 0 | 5.5 | 9.0 | 21.0 | 64.5 | 12 | 7,000 |
| Ex. 10 | 3 | 5.2 | 8.5 | 20.0 | 66.3 | 12 | 15,000 |

TABLE 2-continued

| Ex. 11 | 6.0 | 5.3 | 8.8 | 22.0 | 63.9 | 13 | 20,000 |
|---|---|---|---|---|---|---|---|
| Ex. 12 | 10.0 | 5.5 | 9.2 | 21.2 | 64.1 | 14 | 8,000 |

*1) The optimal recording sensitivity is expressed by a laser power for recording with which the jitter value is minimized. It is desirable that the optimal recording sensitivity be 15 mW or less.

*2) The maximum number of repeated overwriting operations is expressed by the number of overwriting cycles just before there is a sudden increase in jitter value. It is desirable that the maximum number of repeated overwriting operations be 1,000 times or more.

As is apparent from the results shown in Table 2, the maximum number of repeated overwriting operations of the optical recording medium is satisfactory when the concentration of the nitrogen gas is 10 mol % or less in the sputter chamber in the course of the formation of the recording layer by sputtering.

In addition, an oxide comprising In, or a nitride comprising In or Te was observed in the obtained recording layer when the nitrogen gas was added to the argon gas in the sputtering process. In particular, it was confirmed that the chemical bonding of Te—N or Sb—Te—N in the recording layer has considerable effect on the increase of the maximum number of repeated overwriting operations.

Figure 5:
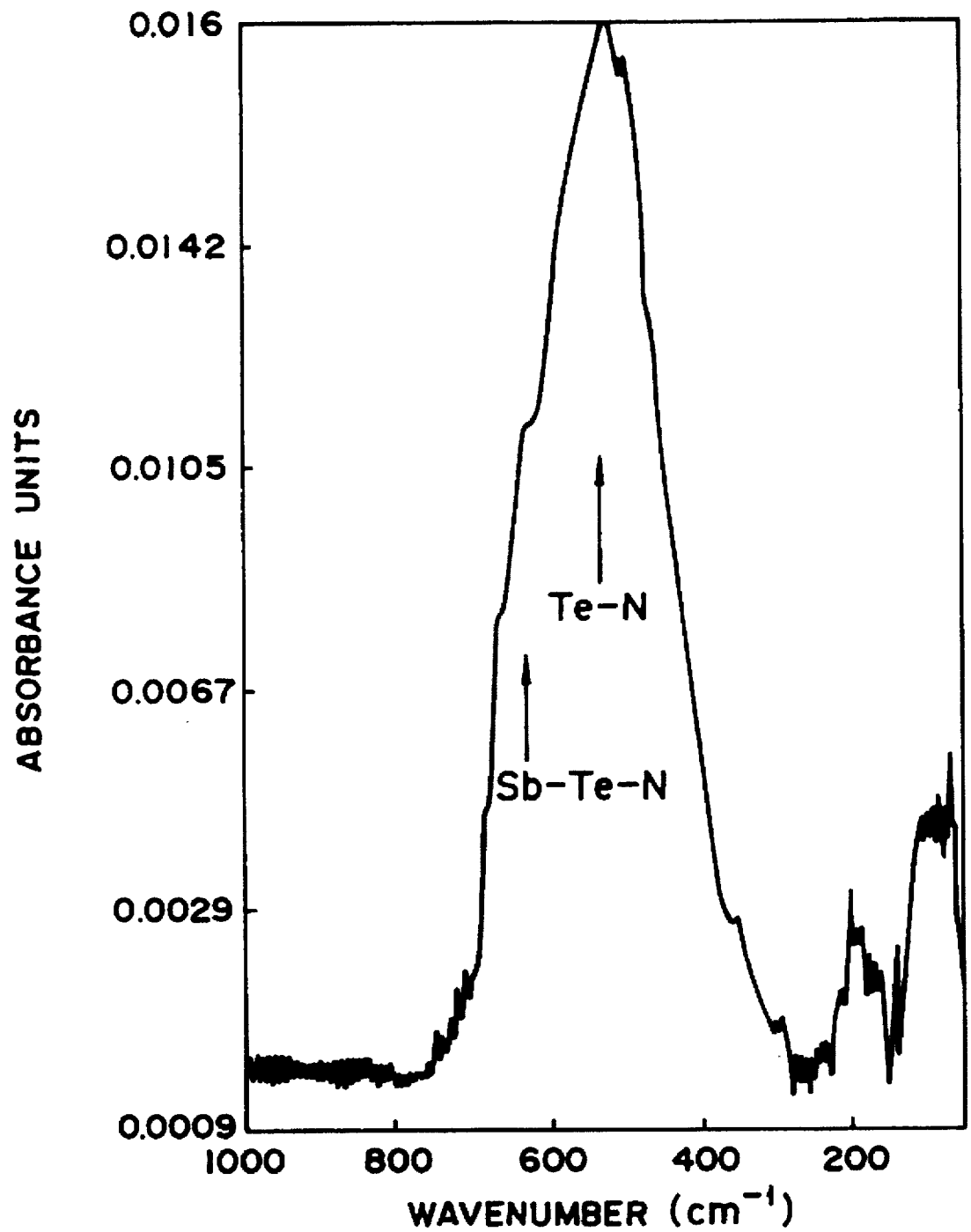
FIG. 5 is an FT-IR spectrum of an Ag—In—Sb—Te—N film which is obtained by sputtering a target in an atmosphere of a mixed gas comprising argon and nitrogen with the concentration of the nitrogen being controlled to 3 mol %, in comparison with that of an Ag—In—Sb—Te film which is obtained by sputtering the same target in an atmosphere of argon.

A sample recording layer with a thickness of 1000 Å was provided on an Si-wafer by sputtering using the sputtering target in a sputter chamber, with the concentration of nitrogen gas in the mixed gas (Ar+$N_2$) being controlled to 3 mol %. The sample of the recording layer thus obtained was analyzed by the FT-IR. FIG. 5 shows the FT-IR spectrum of the above obtained sample in comparison with that of a sample of the recording layer which was deposited on the Si-wafer by sputtering using the same target with no nitrogen being contained in the atmosphere during the sputtering process.

In the above-mentioned FT-IR analysis, a commercially available instrument "IFS-113 V" (made by Bruker Corp.) was employed.

EXAMPLE 13

It was confirmed that each of the sputtering targets employed in Examples 1 to 8 for fabricating each recording layer comprises $AgInTe_2$ crystallites with a particle size of 450 Å or less.

The procedure for fabricating the disk-shaped optical recording medium No. 2 in Example 2 was repeated except that the target for fabricating the recording layer of the recording medium No. 2 in Example 2 was replaced by a target with the same composition as that of the target employed in Example 2, with the particle size of the $AgInTe_2$ crystallites for use in the target material being controlled to 500 Å.

Thus, a disk-shaped optical recording medium No. 13 according to the present invention was fabricated.

The overwriting characteristics of the optical recording medium No. 13 were compared with those of the optical recording medium No. 2 by carrying out the overwriting operation at a disk rotation speed of 2 m/s.

Figure 4:
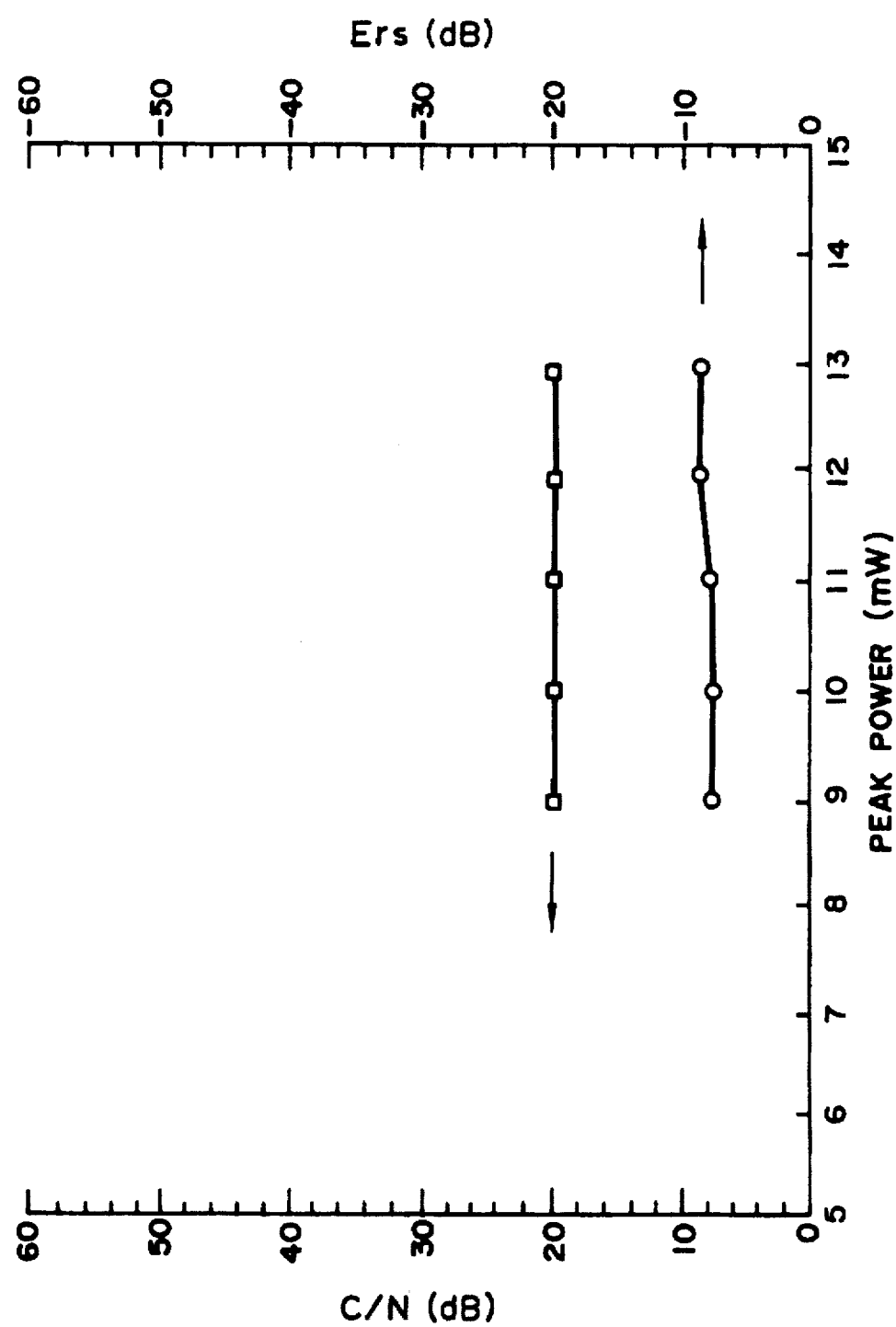
FIG. 4 is a graph which shows the overwriting characteristics of an optical recording medium according to the present invention, whose recording layer is fabricated from a sputtering target comprising $AgInTe_2$ crystallites with a particle size of 500 Å.

FIG. 4 is a graph which shows the overwriting characteristics of the optical recording medium No. 13.

As a result, the optical recording medium No. 2 is superior to the recording medium No. 13 with respect to As a result, the optical recording medium No. 2 is superior to the recording medium No. 13 with respect to the disk characteristics such as the C/N ratio and the erasability.

COMPARATIVE EXAMPLES 11 and 12

In the preparation of the sputtering target for fabricating each recording layer in Examples 1 to 8, a mixture of the constituent elements Ag, In, Te and Sb was fused at a temperature in the range of 550° C. to 850° C.

The procedure for preparation of the sputtering target as employed in Example 2 was repeated except that a mixture of the constituent elements Ag, in, Te and Sb was fused at 500° C. and 900° C., respectively in Comparative Examples 11 and 12, so that comparative sputtering targets were fabricated.

The recording layer was formed using each of the above-mentioned two kinds of sputtering targets, and then comparative disk-shaped optical recording media Nos. 11 and 12 were fabricated in the same manner as in Example 2.

The recording and erasing characteristics of the comparative optical recording medium No. 11 were unsatisfactory for the practical use, and those of the comparative optical recording medium No. 12 were inferior to those of the optical recording medium No. 2.

EXAMPLE 14

Figure 6:
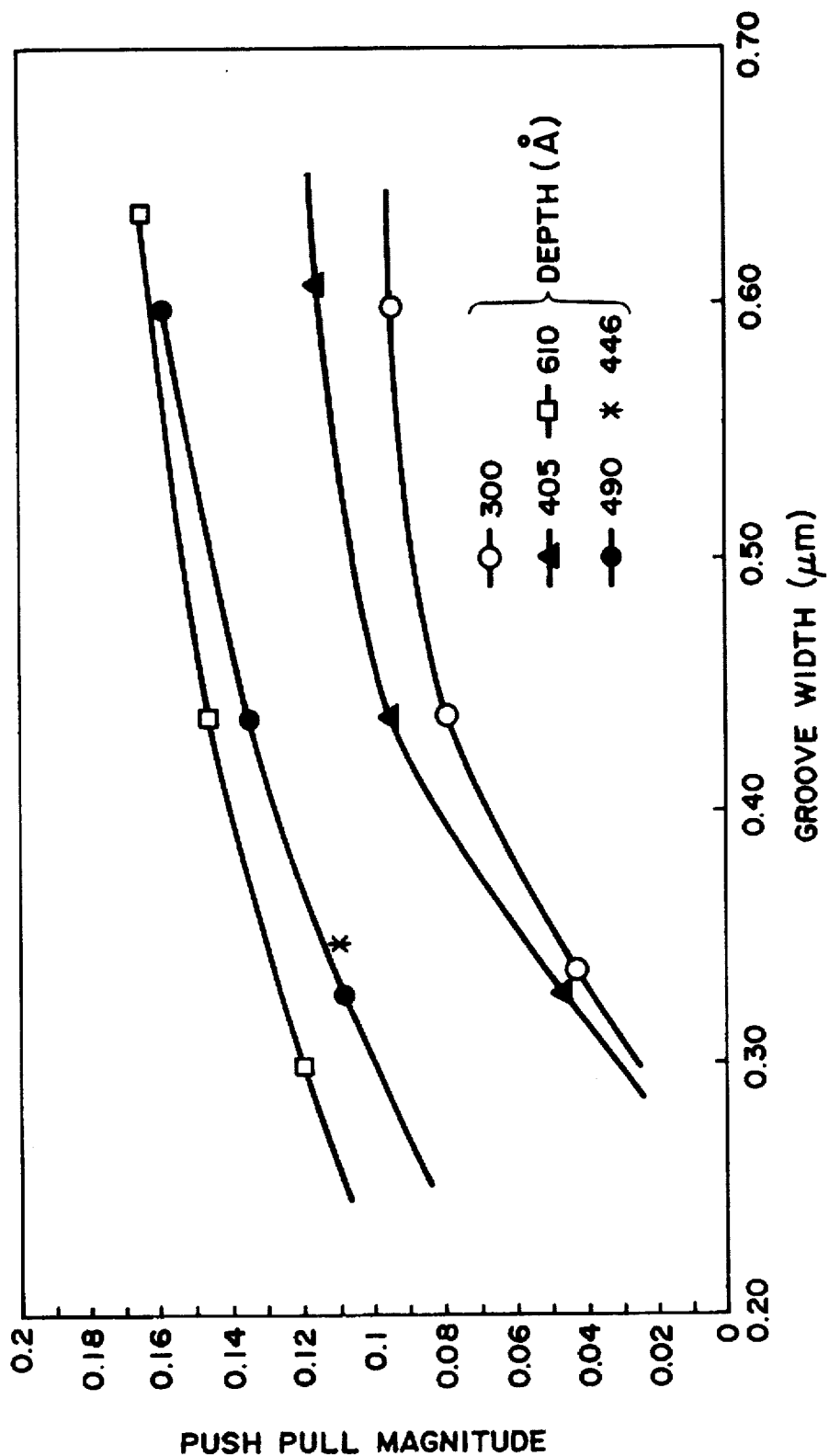
FIG. 6 is a graph which shows the relationship between the width and depth of a guide groove formed on a substrate of the optical recording medium, and the push-pull magnitude after recording.

The procedure for fabricating the disk-shaped optical recording medium No. 2 in Example 2 was repeated except that the width and depth of the guide groove provided on the polycarbonate substrate were variously changed as shown in FIG. 6.

Thus, disk-shaped optical recording media according to the present invention were fabricated.

As can be seen from the graph shown in FIG. 6, satisfactory groove signal characteristics are obtained when the width of the guide groove is in the range of 0.25 to 0.65 μm and the depth of the guide groove is in the range of 250 to 650 Å.

EXAMPLE 15

The procedure for fabricating the disk-shaped optical recording medium No. 2 in Example 2 was repeated except that the thicknesses of the layers constituting the optical recording medium No. 2 were variously changed as shown in Table 3.

Thus, disk-shaped optical recording media No. 15-1 to No. 15-27 according to the present invention were fabricated.

Each of the optical recording media Nos. 15-1 to 15-27 according to the present invention was repeatedly subjected to the overwriting operation, and the maximum obtained.

In addition, the optimal recording sensitivity of each recording medium was obtained in the same manner as in Example 10.

The results are also shown in Table 3.

TABLE 3

| Example No. | Thickness (Å) First heat-resistant protective layer | Recording layer | Second heat-resistant protective layer | Reflective heat dissipation layer | Optimal Recording Sensitivity *1) (mW) | Maximum Number of Repeated Overwriting Operations *2) |
|---|---|---|---|---|---|---|
| Ex. 2 | 2,000 | 250 | 300 | 1,000 | 12 | 15,000 |
| Ex. 15-1 | 1,500 | 250 | 300 | 1,000 | 12 | 15,000 |
| Ex. 15-2 | 1,800 | 200 | 250 | 1,000 | 13 | 20,000 |
| Ex. 15-3 | 2,400 | 200 | 250 | 1,000 | 14 | 8,000 |
| Ex. 15-4 | 500 | 200 | 250 | 1,000 | 14 | 1,000 |
| Ex. 15-5 | 400 | 200 | 250 | 1,000 | 16 | 300 |
| Ex. 15-6 | 2,700 | 200 | 250 | 1,000 | 15 | 800 |
| Ex. 15-7 | 2,000 | 80 | 250 | 1,000 | 16< | 600 |
| Ex. 15-8 | 2,000 | 110 | 250 | 1,000 | 15 | 1,000 |
| Ex. 15-9 | 2,000 | 300 | 250 | 1,000 | 13 | 12,000 |
| Ex. 15-10 | 2,000 | 400 | 250 | 1,000 | 13 | 10,000 |
| Ex. 15-11 | 2,000 | 700 | 250 | 1,000 | 12 | 8,000 |
| Ex. 15-12 | 2,000 | 1,000 | 250 | 1,000 | 11 | 5,000 |
| Ex. 15-13 | 2,000 | 1,200 | 250 | 1,000 | 10 | 700 |
| Ex. 15-14 | 2,000 | 200 | 80 | 1,000 | 16 | 400 |
| Ex. 15-15 | 2,000 | 200 | 120 | 1,000 | 15 | 1,500 |
| Ex. 15-16 | 2,000 | 200 | 400 | 1,000 | 13 | 7,000 |
| Ex. 15-17 | 2,000 | 200 | 600 | 1,000 | 13 | 4,000 |
| Ex. 15-18 | 2,000 | 200 | 800 | 1,000 | 12 | 3,000 |
| Ex. 15-19 | 2,000 | 200 | 1,000 | 1,000 | 11 | 2,000 |
| Ex. 15-20 | 2,000 | 200 | 1,300 | 1,000 | 10 | 1,500 |
| Ex. 15-21 | 2,000 | 200 | 1,600 | 1,000 | 10 | 600 |
| Ex. 15-22 | 2,000 | 200 | 250 | 2,400 | 16< | 1,000 |
| Ex. 15-23 | 2,000 | 200 | 250 | 1,900 | 15 | 1,500 |
| Ex. 15-24 | 2,000 | 200 | 250 | 1,300 | 13 | 7,000 |
| Ex. 15-25 | 2,000 | 200 | 250 | 700 | 12 | 9,000 |
| Ex. 15-26 | 2,000 | 200 | 250 | 400 | 11 | 1,200 |
| Ex. 15-27 | 2,000 | 200 | 250 | 250 | 11 | 200> |

As can be seen from the results shown in Table 3, the recording sensitivity becomes high and the maximum number of repeated overwriting operations can be increased when the thickness of the first heat-resistant protective layer is in the range from 500 to 2500 Å; that of the recording layer, from 100 to 1000 Å; that of the second heat-resistant protective layer, from 100 to 1500 Å; and that of the reflective heat dissipation layer, from 300 to 2000 Å.

To be more specific with reference to Table 3, the effect of the optimal thickness of the first heat-resistant protective layer is shown in the results of Examples 15-1 to 15-6; the effect of the optimal thickness of the recording layer, in Examples 15-7 to 15-13; the effect of the optimal thickness of the second heat-resistant protective layer, in Examples 15-14 to 15-21; and the effect of the optimal thickness of the reflective heat dissipation layer, in Examples 15-22 to 15-27.

As previously explained, the phase-change optical recording medium of the present invention achieves high performance for C/N ratio, erasability, recording and erasing sensitivities, and repetition reliability.

The advantages of the above-mentioned properties can be obtained from the following factors:

(1) The recording layer comprises the phase-change recording material comprising as constituent elements Ag, In, Te and Sb with the respective atomic percents of $\alpha$, $\beta$, $\gamma$ and $\delta$ thereof being in the relationship of $1 \leq \alpha < 6$, $7 \leq \beta \leq 20$, $20 \leq \gamma \leq 35$, $35 \leq \delta \leq 70$, and $\alpha + \beta + \gamma + \delta = 100$. Therefore, there can be obtained a recording layer with excellent overall characteristics required for the phase-change optical recording disk at a low linear speed of 1.2 to 5.6 m/s.

(2) When a first heat-resistant protective layer, the above-mentioned recording layer, a second heat-resistant protective layer and a reflective heat dissipation layer are overlaid on a substrate in this order, the phase-change optical recording medium with excellent overall characteristics can be obtained.

(3) When the substrate bears thereon a guide groove with a width of 0.25 to 0.65 µm and a depth of 250 to 650 Å, the compatibility of the obtained optical recording disk with the CD-ROM or the CD-R can be easily ensured.

(4) In the case where the phase-change recording material for use in the recording layer comprises $AgSbTe_2$ in a crystalline phase when no information is recorded in the recording layer and after information is erased therefrom, the erasing characteristics of the recording medium can be improved.

(5) When the first heat-resistant protective layer has a thickness of 500 to 2500 Å, the recording layer has a thickness of 100 to 1000 Å, the second heat-resistant protective layer has a thickness of 100 to 1500 Å, and the reflective heat dissipation layer has a thickness of 300 to 2000 Å, the overall characteristic of the obtained phase-change optical recording medium are excellent at a low linear speed of 1.2 to 5.6 m/s.

(6) By applying the phase-change optical recording medium of the present invention to an optical recording method, the method capable of recording information with a large capacity can be provided.

(7) By use of the phase-change optical recording medium of the present invention, there can be provided an optical recording method suitable for CD-rewritable application or the modified application thereof.

(8) A sputtering target for fabricating a recording layer of an optical recording medium comprises a target material comprising as constituent elements Ag, In, Te and Sb with the respective atomic percents (atom. %) of $\alpha$, $\beta$, $\gamma$ and $\delta$ thereof being in the relationship of $0.5 \leq \alpha < 8$, $5 \leq \beta \leq 23$, $17 \leq \gamma \leq 38$, $32 \leq \delta \leq 73$, $\alpha \leq \beta$, and $\alpha+\beta+\gamma+\delta=100$. Therefore, excellent phase-change optical recording medium can be provided by using such a target as a starting material for the recording layer.

(9) When the target material for use in the above-mentioned sputtering target comprises Sb, and $AgInTe_2$ with a stoichiometric composition and/or a nearly stoichiometric composition having a chalcopyrite structure and/or zincblende structure, excellent phase-change optical recording medium can be provided.

(10) Further, when the crystallites of $AgInTe_2$ in the target material have a particle size of 450 Å or less, excellent phase-change optical recording medium can be provided.

(11) The above-mentioned sputtering target can be produced by fusing a mixture of Ag, In and Te elements at a temperature in the range of 550° C. to 850° C. to prepare a fused mixture; rapidly cooling the fused mixture to prepare a solid lump; pulverizing the solid lump to prepare finely-divided particles; mixing the finely-divided particles with Sb; and sintering the mixture of the finely-divided particles and Sb.

(12) Alternatively, the sputtering target can also be produced by fusing a mixture of Ag, In, Te and Sb elements at a temperature in the range of 550° C. to 850° C. to prepare a fused mixture; rapidly cooling the fused mixture to prepare a solid lump; pulverizing the solid lump to prepare finely-divided particles; and sintering the finely-divided particles.

(13) When the step of subjecting the mixture of the finely-divided particles to heat treatment at a temperature not higher than the melting point of the mixture is included prior to the sintering step in the above-mentioned method of producing the sputtering target, the obtained phase-change optical recording medium is stable.

(14) According to the present invention, a recording layer for an optical recording medium can be formed by sputtering the previously mentioned target in an atmosphere of argon gas, with nitrogen gas being contained therein with a concentration of 0 to 10 mol %.

(15) A small amount of nitrogen gas to be contained in the recording layer can be controlled with no difficulty when the partial pressure of the nitrogen gas ($P_N$) is set in the range of $1 \times 10^{-5}$ Torr $\leq (P_N) \leq 8 \times 10^{-5}$ Torr during the sputtering step.

(16) When the back pressure p is set in the range of $3 \times 10^{-7} \leq p \leq 5 \times 10^{-6}$ Torr prior to the sputtering step in the above-mentioned method of forming the recording layer for the optical recording medium, there can be obtained a phase-change optical recording medium with high performance and improved stability.

(17) When there is introduced into the atmosphere after the sputtering step a mixed gas comprising argon gas and nitrogen gas with the concentration of the nitrogen gas being higher than that during the sputtering step, there can be obtained a phase-change optical recording medium with high performance and improved stability.

(18) When the recording layer of the phase-change optical recording medium according to the present invention further comprises a nitride and/or oxide comprising at least one of the constituent elements Ag, In, Te and Sb, the characteristics of the obtained recording medium are further improved, in particular, with respect to the maximum number of repeated overwriting operations and the repetition reliability.

(19) When the above-mentioned nitride in the recording layer comprises Te with a Te—N bond, the maximum number of repeated overwriting operations can be further increased and the optimal linear speed of disk rotation can be easily controlled as desired.

What is claimed is:

1. A sputtering target which comprises a target material comprising as constituent elements Ag, In, Te and Sb with the respective atomic percents (atom. %) of $\alpha$, $\beta$, $\gamma$ and $\delta$ thereof being in the relationship of:

$0.5 \leq \alpha < 8$, $5 \leq \beta \leq 23$, $17 \leq \gamma \leq 38$, $32 \leq \delta \leq 73$, $\alpha \leq \beta$, and $\alpha+\beta+\gamma+\delta=100$.

wherein said target material comprises Sb, and $AgInTe_2$ with a stoichiometric composition and/or a nearly stoichiometric composition having a chalcopyrite structure and/or zincblende structure.

2. The sputtering target as claimed in claim 1, wherein said $AgInTe_2$ in said target material is in the form of crystallites with a particle size of 450 Å or less.

* * * * *